(12) United States Patent
Ruehli et al.

(10) Patent No.: US 6,192,507 B1
(45) Date of Patent: Feb. 20, 2001

(54) METHOD FOR GENERATING AN ELECTRICAL CIRCUIT COMPRISING DIELECTRICS

(75) Inventors: Albert Emil Ruehli, Chappaqua; Barry Jay Rubin, Croton-on-Hudson, both of NY (US)

(73) Assignee: International Business Machines Corporation, Armonk, NY (US)

( * ) Notice: Under 35 U.S.C. 154(b), the term of this patent shall be extended for 0 days.

(21) Appl. No.: 09/085,159

(22) Filed: May 27, 1998

(51) Int. Cl.[7] .......................... G06F 17/50; G06F 17/16; G06F 19/00
(52) U.S. Cl. ...................................... 716/5; 716/3; 700/98
(58) Field of Search .................. 395/500.02–500.19; 716/1–21; 364/468.01–468.04; 700/95–98

(56) References Cited

U.S. PATENT DOCUMENTS

| | | | |
|---|---|---|---|
| 5,610,833 | * 3/1997 | Chang et al. | 716/11 |
| 5,675,499 | * 10/1997 | Lee et al. | 716/19 |
| 5,764,533 | * 6/1998 | DeDood | 716/8 |
| 5,901,063 | * 5/1999 | Chang et al. | 716/4 |
| 6,016,390 | * 1/2000 | Mali et al. | 716/17 |
| 6,057,171 | * 5/2000 | Chou et al. | 438/15 |
| 6,061,508 | * 5/2000 | Mehrotra et al. | 716/6 |
| 6,066,179 | * 5/2000 | Allan | 716/4 |

OTHER PUBLICATIONS

Elsherbeni et al. ("Coupling between two–conductor multi–layer shielded microstrip transmission line", Proceedings SSST '93, Twenty–Fifth Southeastern Symposium on System Theory, 1993, Mar. 7, 1993, pp. 6–10).*

Kolbehdari et al. ("Finite and infinite element analysis of coupled cylindrical microstrip line in a nonhomogeneous dielectric media", Proceedings of IEEE Southeastcon '95, Mar. 26, 1995, pp. 269–273).*

Wang et al. ("Fabrication and microwave characterization of multilayer circuits for MMIC applications", IEE Proceedings on Microwaves, Antennas and Propagation, vol. 143, No. 3, Jun., 1996, pp. 225–232).*

Affane et al. ("Quasi static analysis of hybrid and monolithic integrated circuits interconnections", Procedings of 43rd Electronic Components and Technology Conference, Jun. 1, 1993, pp. 1055–1060).*

* cited by examiner

Primary Examiner—Kevin J. Teska
Assistant Examiner—Phallaka Kik
(74) Attorney, Agent, or Firm—McGinn & Gibb, P.C.; Stephen C. Kaufman, Esq.

(57) ABSTRACT

A method comprising a computational procedure for obtaining capacitances for three-dimensional geometries which include multiple regions with different dielectric constants. The methodology is not limited to uniform dielectrics. The dielectric regions can also consist of non-uniform and/or anisotropic materials.

12 Claims, 3 Drawing Sheets

Fig. 2a  Fig. 2b

Example of boundaries with surface cells only

METHOD FOR GENERATING AN ELECTRICAL CIRCUIT COMPRISING DIELECTRICS

FIELD OF THE INVENTION

This invention relates to a novel method for generating an electrical circuit comprising dielectrics.

INTRODUCTION TO THE INVENTION

Our motivation and methodology for the present invention are informed by an illustrative situation which centers on models for VLSI chip and package interconnects as well as microwave circuits. The computation of capacitances represents a central part of the electrical modeling for all these structures. Many of these structures involve the presence of different dielectrics regions. The dielectrics may be anisotropic and/or inhomogeneous, depending on the application.

SUMMARY OF THE INVENTION

It is necessary to calculate the capacitances of arbitrary three dimensional structures that may involve single or multiple regions of dielectric material. The material may be anisotropic and/or inhomogeneous, and vary from one part of the structure to the other.

We have now discovered a novel method for the computation of capacitances for multiconductor conductor problems in the presence of various dielectric bodies. The method involves a circuit consisting of two sets of capacitances, one that accounts for the dielectric volumes and a second that accounts for the conductors and dielectric interfaces. The computation of capacitance is accomplished by exciting the conductors of this circuit and then observing the total charges established on the conductors. This method is equally applicable to other capacitance computation problems for which the capacitances of a multiconductor situation are of interest. In this way, we advantageously solve the above problem, and fulfill an important need.

The new method comprises the steps of:

1. specifying a first electrical circuit comprising a three dimensional geometry, said geometry having a first volume portion consisting of a dielectric and a second portion consisting of a conductor;

2. identifying within said geometry regions comprising same of different dielectric constants; and 3. generating a second electrical circuit derived from the first electrical circuit, said second electrical circuit characterized by capacitive couplings;
   (a) localized to said conductor portion;
   (b) localized to dielectric interfaces;
   (c) localized to dielectric volumes; and
   (d) between conductor and dielectric interfaces.

DETAILED DESCRIPTION OF THE DRAWINGS

The invention is illustrated in the accompanying drawings, in which.

DETAILED DESCRIPTION OF THE INVENTION

The detailed description of the invention proceeds as follows. In section 1 we set forth the notation. In section 2 we introduce the formulations. In sections 3 and 4 we apply the technique to an example and give numerical results to show the robustness of the method.

1. Capacitance Calculations Including Multiple Dielectric Bodies

Here we show a new way for the efficient calculation of quasi static capacitances for VLSI integrated circuits and other geometries which involve the computation of capacitances in the presence of finite dielectric bodies. This problem is very important for the analysis of VLSI chip as well as VLSI package capacitances.

2. Capacitance Calculation For The General Problem With Anisotropic And/Or Inhomogeneous Dielectric 2.1 Treatment Of Dielectrics With Excess Capacitances The approaches which have been applied to the solution of this problem in the past are based on a boundary condition for the continuity of the electric field as well as the electric flux across the boundary between the two materials of different dielectric constants. We note that these techniques have severe limitations in that the dielectric constants of the material bodies cannot be too different since the system of equations becomes singular for large differences in the dielectric constants.

The new technique disclosed here can be applied to both two and three dimensional geometries. Also, it is less complicated to implement than the old boundary approach. Further, it is more robust and it works for very large dielectric constants. A parallel processing solution can be used for the solution of problems with multiple dielectric regions since some reduction can be performed on each dielectric regions by eliminating the internal nodes independent of the rest of the environment.

Figure 1:
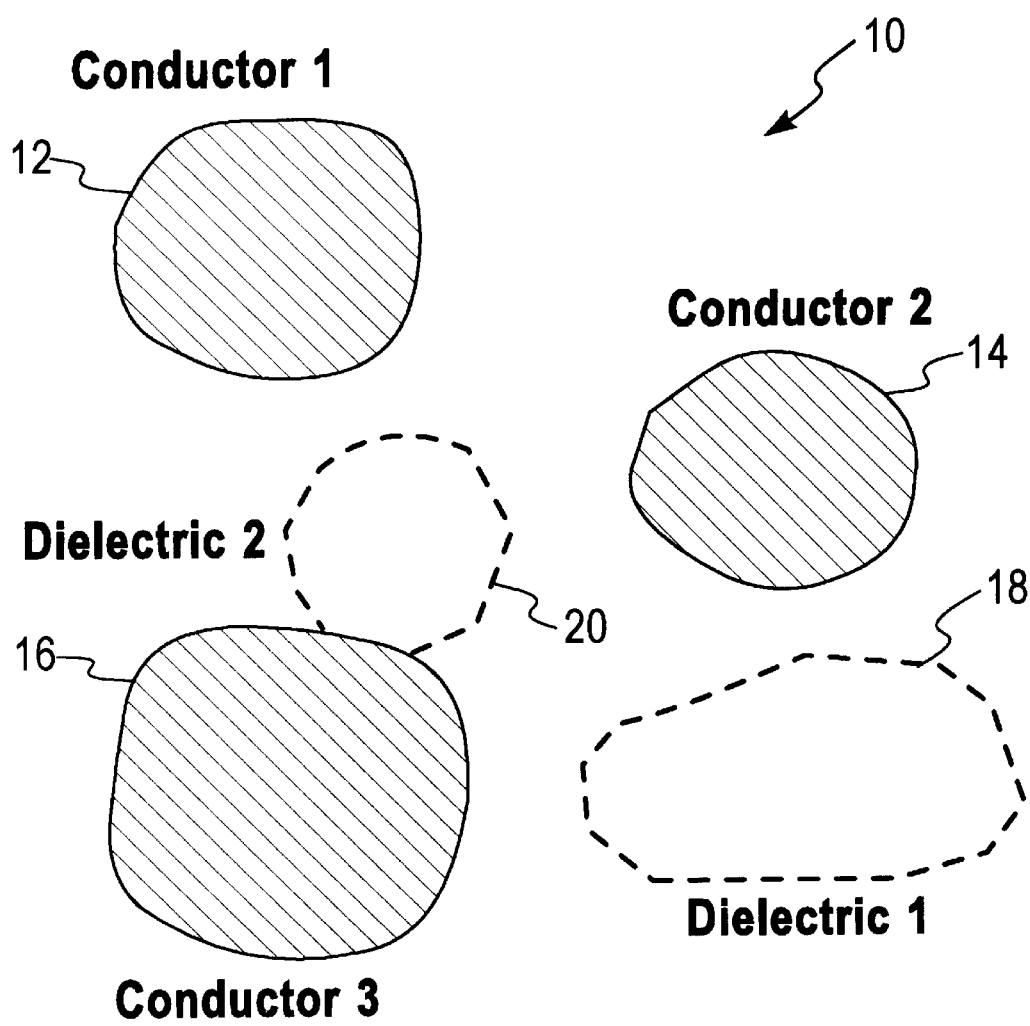
FIG. 1 is an example of a capacitance problem comprising three conducting bodies and two dielectric bodies.

An example problem for a three dimensional geometry is shown in FIG. 1, numeral 10. There are three conducting bodies (12,14,16) and two dielectric bodies (18,20) which in general can be arranged in an arbitrary way. We start by generating the capacitances associated with a dielectric volume; later these capacitances will be stamped into the matrix equation that represents the general problem. We first separate the free-space contributions of the dielectrics, with the remainder labeled as the excess contribution. Let $$\epsilon_r = \epsilon_e + 1 \tag{1}$$

where $\epsilon_r$ is the relative dielectric constant of the material and $\epsilon_e$ is the excess relative dielectric constant. The electric flux density D is related to the applied electric field E through $$\overline{D} = \epsilon_0 \epsilon_r \overline{E} \tag{2}$$

where $\epsilon_0$ is the permittivity of free space. In expanded form, equation (2) becomes $$\begin{bmatrix} D_x \\ D_y \\ D_z \end{bmatrix} = \begin{bmatrix} \epsilon_{xx} & \epsilon_{xy} & \epsilon_{xz} \\ \epsilon_{yx} & \epsilon_{yy} & \epsilon_{yz} \\ \epsilon_{zx} & \epsilon_{zy} & \epsilon_{zz} \end{bmatrix} \begin{bmatrix} E_x \\ E_y \\ E_z \end{bmatrix}. \tag{3}$$

From equations (1), (2), and (3), the expanded form of the relative dielectric constant associated with the excess capacitance is $$\begin{bmatrix} \epsilon_{xx}-1 & \epsilon_{xy}-1 & \epsilon_{xz}-1 \\ \epsilon_{yx}-1 & \epsilon_{yy}-1 & \epsilon_{yz}-1 \\ \epsilon_{zx}-1 & \epsilon_{zy}-1 & \epsilon_{zz}-1 \end{bmatrix}. \tag{4}$$

Figure 2C:
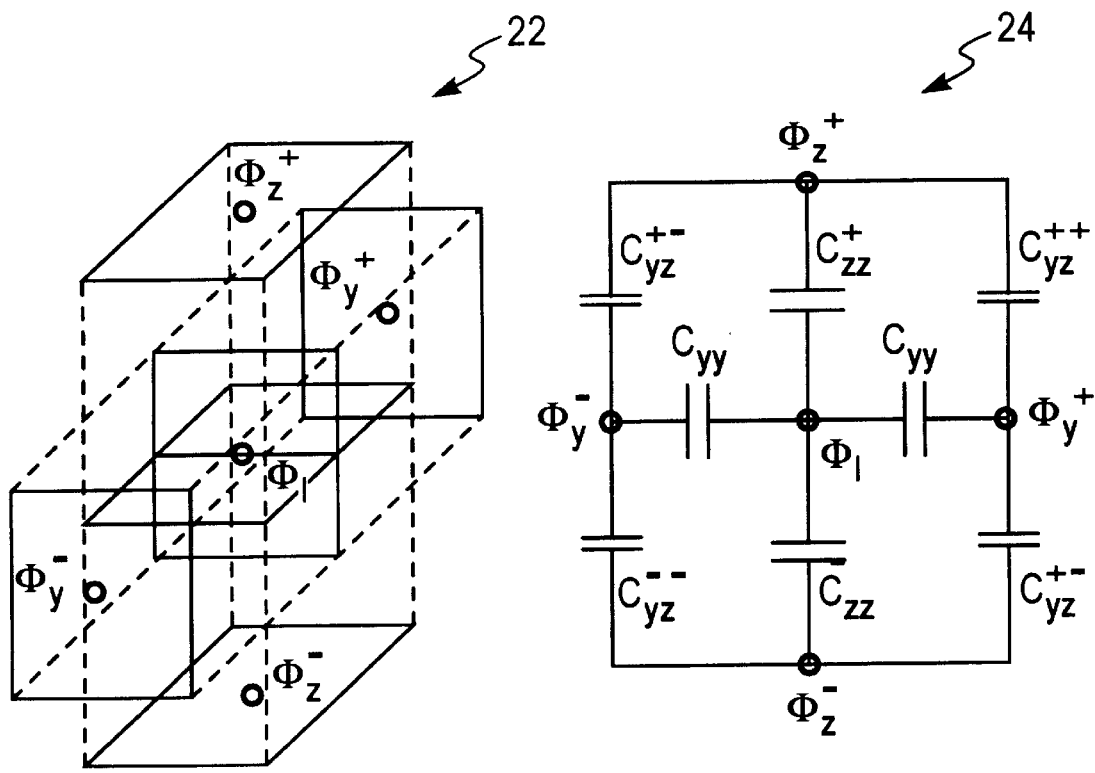
FIGS. 2 (2a, 2b, 2c) shows a dielectric subdivided into cells which are represented by a circuit of capacitances.

We assume that the dielectric volumes are discretized by subdividing them into three dimensional rectangular cells. While we show the derivation for the rectangular case, it can also be applied to the non-rectangular case as well. One cell of the discretized region is shown in FIG. 2a, numeral 22. The small circles represent the electrical nodes. We show only the y and z directions, and assume that the same type of cells are used in the x direction. We now represent the region with a set of excess capacitances. The plates in numeral 24 in FIG. 2b form parallel plate capacitors bounded by the dashed lines. The capacitance values are determined, through the ideal parallel-plate formula, by the excess relative dielectric constant (4), the areas of the plates and the separation of the plates. The areas and separations of the plates are simply related to the dimensions of the rectangular cell. Consistent with the parallel-plate approximation, we can express the electric field in terms of the potentials shown in FIG. 2a and the distances between the plates. The electric flux D can be expressed in terms of the charges on the plates and areas of the plates. Using the above details, we can express the equivalent excess capacitances as $$\begin{bmatrix} Q_x \\ Q_y \\ Q_z \end{bmatrix} = \begin{bmatrix} \epsilon_0(\epsilon_{xx}-1)\frac{\alpha_x}{\delta_x} & \epsilon_0(\epsilon_{xy}-1)\frac{\alpha_x}{\delta_x} & \epsilon_0(\epsilon_{xz}-1)\frac{\alpha_x}{\delta_x} \\ \epsilon_0(\epsilon_{yx}-1)\frac{\alpha_y}{\delta_y} & \epsilon_0(\epsilon_{yy}-1)\frac{\alpha_y}{\delta_y} & \epsilon_0(\epsilon_{yz}-1)\frac{\alpha_y}{\delta_y} \\ \epsilon_0(\epsilon_{zx}-1)\frac{\alpha_z}{\delta_z} & \epsilon_0(\epsilon_{zy}-1)\frac{\alpha_z}{\delta_z} & \epsilon_0(\epsilon_{zz}-1)\frac{\alpha_z}{\delta_z} \end{bmatrix} \begin{bmatrix} \Phi_x^+ - \Phi_i \\ \Phi_y^+ - \Phi_i \\ \Phi_z^+ - \Phi_i \end{bmatrix} \tag{5}$$

where $\alpha_x$, $\alpha_y$, and $\alpha_z$ are the areas of the plates and $\delta_x$, $\delta_y$, and $\delta_z$ are the distances between the plates. Clearly, the areas may also be expressed in terms of $\delta_x$, $\delta_y$, and $\delta_z$. Eq. (5) can be expressed in compact form as $$Q = C_e \Phi. \tag{6}$$

When inhomogeneous dielectric regions are present, they are subdivided into appropriately small rectangular cells. Over its volume, each cell has a uniform value of dielectric constant, which may be different from that of its neighbors. The capacitances represented by equation (6) will be applied in the next section.

2.2 General Capacitance Formulation

Figure 2C:
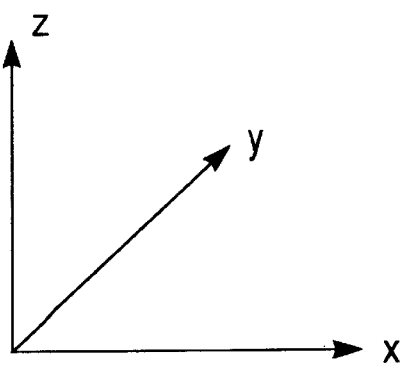
Figure 3:
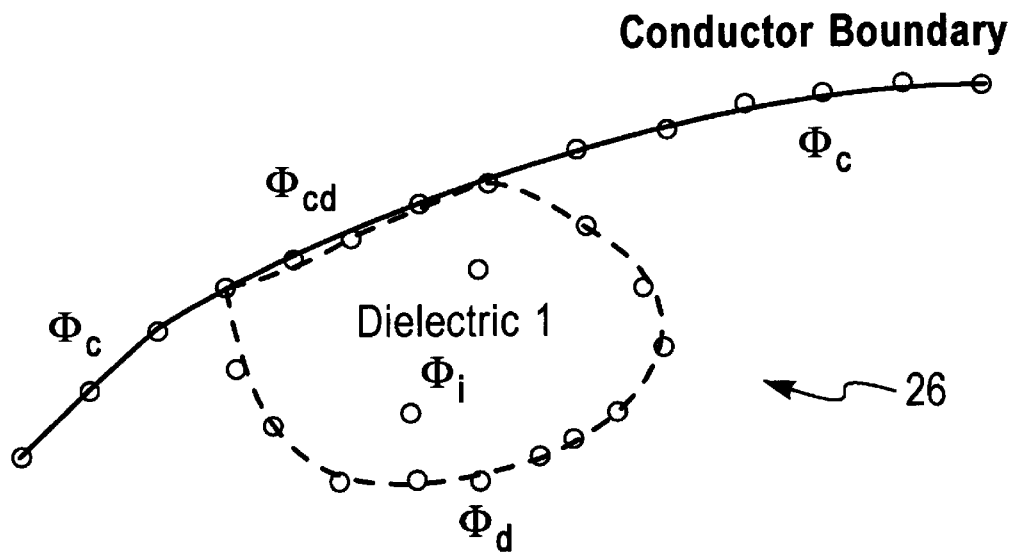
FIG. 3 shows a schematic representation of the boundaries and the subdivisions on the boundaries.

In FIG. 1 we gave an example of a capacitance problem with three conductors and two dielectric regions that have different dielectric constants. To account for the general case, we can reduce all the possible situations into a single formulation. FIG. 3, numeral 26, gives a schematic representation of the boundary that involves all possible combinations of touching conductors and dielectrics. The portion where the potential is marked as $\Phi_c$ is the one where a conductor touches free space. The portion where the potential is marked as $\Phi_{cd}$ is the one where a dielectric with $\epsilon_r > 1$ touches the conductor. Further, the boundary marked with $\Phi_d$ shows the situation where the dielectric interfaces with free space or other dielectrics. Finally the internal nodes, which are associated with the dielectric volume only, are indicated by $\Phi_i$. The internal nodes marked by $\Phi_i$ are the ones corresponding to cell potential $\Phi_i$ in FIG. 2. In our formulation, we utilize the special coefficients of potential which are based on the formula (7)

$$\Phi(\vec{r}) = \frac{1}{\epsilon} \int_a G(\vec{r}, \vec{r}') q(\vec{r}') d\bar{a}'. \tag{7}$$

All surfaces are divided into cells on which the charge is assumed to have a certain distribution. Here, to explain the technique, we assume that the cells are uniformly charged. The cell subdivisions are indicated in FIG. 3 in a two dimensional way to keep the drawing simple. We indicate the divisions between the cells by small circles. It should be noted here that in a static solution, charges exist only on the conductor surfaces and not inside any conductor volume. The potential coefficient integrals in Eq. 7 are evaluated pairwise over all the surface cells and have the form $$p_p(i,j) = \frac{1}{a_i a_j \epsilon} \int_{a_i} \int_{a_j} G(\vec{r}, \vec{r}') d\bar{a} d\bar{a}'. \tag{8}$$

The normalization chosen here is beneficial to the solution accuracy.

Next, all the coefficients of potential can be collected in a system of equations of the form $$\Phi = P_p Q \tag{9}$$

where the $\Phi$ is the potential for all the cells including the internal ones in FIG. 3. The charge Q is the total charge on the cells, while $P_p$ are the normalized coefficients of potential for the geometry at hand, where the subscript p refers to the conducting plates described below. This system is rearranged lumping together all the internal nodes with the index i and lumping together all the nodes of the dielectric surfaces with the index d. Finally, the pure conductor nodes and the ones for the mixed dielectric-conductor interface are lumped together with index c. This leads, from Eq. 9, to the detailed expression $$\begin{bmatrix} p_{ii} & p_{id} & p_{ic} \\ p_{di} & p_{dd} & p_{dc} \\ p_{ci} & p_{cd} & p_{cc} \end{bmatrix} \begin{bmatrix} Q_i \\ Q_d \\ Q_c \end{bmatrix} = \begin{bmatrix} \Phi_i \\ \Phi_d \\ \Phi_c \end{bmatrix}. \tag{10}$$

Figure 4:
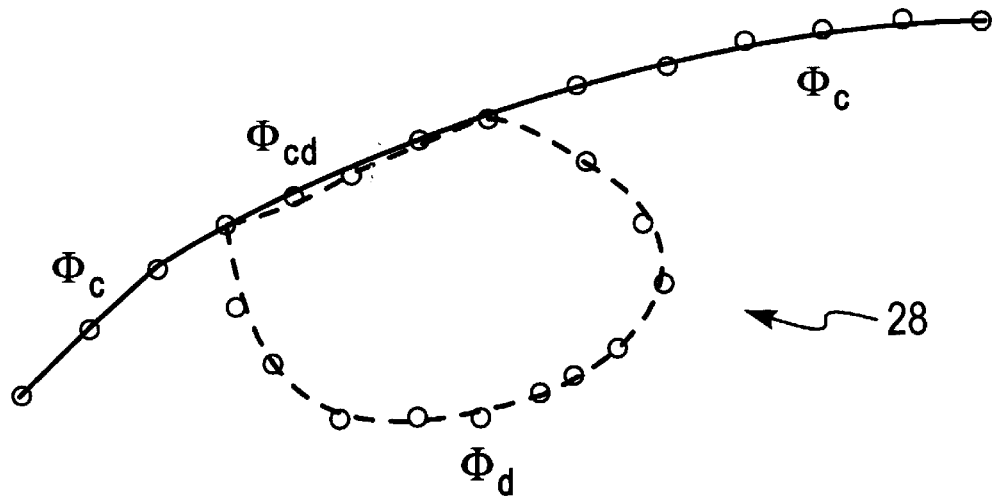
FIG. 4 shows the location of the charges on the boundaries for FIG. 3.

To set up the general algorithm, we assume that the conductors consist of $N_p$ independent plates for which we want to compute a P×P short circuit capacitance matrix $C_s$. We assume that a total of $N_c$ cells are associated with the conductors, a total of $N_d$ cells are located on the various interfaces between the regions of different dielectric constants and a total number of nodes $N_i$ are internal to the dielectric. It should be noted that the only sparse part to the matrix is due to the internal nodes $N_i$. The ordering we choose for Eq. 10 places the sparse part at the beginning of the solution vector and further, we re-order the internal nodes so that the resulting sub matrix conforms to what is known as skyline shape. This allow a highly efficient matrix solution via LU decomposition. Since the matrix is symmetric, we have to store only the upper triangular portion of the matrix and many of the following operations are sped up by the symmetric nature of the various submatrices. It is important to note that we in fact do not set up the full system of equations in the form specified by Eq. 10, but rather form only the system $$\begin{bmatrix} p_{dd} & p_{dc} \\ p_{cd} & p_{cc} \end{bmatrix} \begin{bmatrix} Q_d \\ Q_c \end{bmatrix} = \begin{bmatrix} \Phi_d \\ \Phi_c \end{bmatrix} \qquad (11)$$

which involves all the cells on all the conductors and all the cells corresponding to the dielectric interface as is shown in FIG. 4, numeral 28. The inversion or solution of Eq. 11 is then given by $$\begin{bmatrix} cs_{dd} & cs_{dc} \\ cs_{cd} & cs_{cc} \end{bmatrix} \begin{bmatrix} \Phi_d \\ \Phi_c \end{bmatrix} = \begin{bmatrix} Q_d \\ Q_c \end{bmatrix} \qquad (12)$$

This matrix is of a size $N_d+N_c$. Since the short circuit capacitances can easily be converted to conventional two terminal capacitances, we can view this as a circuit of capacitances which represent the background with $\epsilon_r=1$. It includes the couplings to the dielectric interface regions and conductors.

Finally, we want to form the complete short circuit capacitance matrix for the entire system of size $N_i+N_d+N_c$ by adding the capacitance circuit for the dielectrics to Eq. 12. For this we take the capacitances computed for the general case, as represented by Eq. (5) and (6) in section 2.1. The capacitances are stamped into the matrix using a conventional circuit analysis technique such as the Modified Nodal Analysis (MNA) approach. It should be noted here that the potentials labeled in FIG. 2a are those associated with nodes that are adjacent to node i. This leads to a global short circuit capacitance matrix for the entire system of the form $$C_s\Phi=Q \qquad (13)$$

or more explicitly $$\begin{bmatrix} cs_{ii} & cs_{id} & cs_{ic} \\ cs_{di} & cs_{dd} & cs_{dc} \\ cs_{ci} & cs_{cd} & cs_{cc} \end{bmatrix} \begin{bmatrix} \Phi_i \\ \Phi_d \\ \Phi_c \end{bmatrix} = \begin{bmatrix} Q_i \\ Q_d \\ Q_c \end{bmatrix} \qquad (14)$$

Importantly, the next step involves the reduction of the conductor part of Eq. 14. The matrix entries corresponding to the cells of a particular conducting plate are compressed in this system by adding together all the rows, and then all the columns corresponding to that plate. This compression is justified, since all the cells on a particular plate are at the same potential, and further, the sum of these charges is the total charge on the plate. Hence, the solution vector is reduced in size from from $N_d+N_i+N_c$ to $N_d+N_i+N_p$. This leads to a new system having the form $$\begin{bmatrix} cs_{ii} & cs_{id} & cs_{ip} \\ cs_{di} & cs_{dd} & cs_{dp} \\ cs_{ci} & cs_{cd} & cs_{cp} \end{bmatrix} \begin{bmatrix} \Phi_i \\ \Phi_d \\ \Phi_p \end{bmatrix} = \begin{bmatrix} Q_i \\ Q_d \\ Q_p \end{bmatrix}. \qquad (15)$$

The system Eq. 15 finally is used for the capacitance calculations for the general problem. For the capacitance calculations we need to obtain the relationship between $\Phi_p$ and $Q_p$ and place it in the form $$Q_p=C_p\Phi_p \qquad (16).$$

We only will apply external connections to the nodes that correspond to the $\Phi_p$ vector, where the corresponding currents are $$i_p = \frac{\partial Q_p}{\partial t}. \qquad (17)$$

Since we can assume that the system is originally in a discharged state, the currents and the charges supplied externally to the cells $Q_i$ and $Q_d$ are zero.

We next simplify the system by rewriting the system as smaller matrix, where the vector $\Phi_a^T=(\Phi_i\Phi_d)^T$, yielding $$\begin{bmatrix} cs_{aa} & cs_{ap} \\ cs_{pa} & cs_{pp} \end{bmatrix} \begin{bmatrix} \Phi_a \\ \Phi_p \end{bmatrix} = \begin{bmatrix} 0 \\ Q_p \end{bmatrix}. \qquad (18)$$

Solving the matrix equation (18), we find $$Q_p = (cs_{pp} - cs_{pa}cs_{aa}^{-1}cs_{ap})\Phi_p. \qquad (19)$$

Of course, this process which we outlined above can be more efficiently handled by realizing that $cs_{aa}$ has a sparse portion with skyline shape, $cs_{ii}$, as noted earlier and using a sparse matrix solver. The result is the desired final short circuit capacitance matrix.

$$Q_p=C_p\Phi_p \qquad (20)$$

which is of the size of the number of plates. $C_p$ is the desired short circuit capacitance matrix.

3. Implementation Of The Capacitance Computation Method

The algorithm described has been implemented in a Fortran subroutine on an IBM RS6000 computer using the AIX operating system. As test, we apply the algorithm to solving the problem of a set of two parallel plates between which is placed an finite insulator having relative dielectric constant $\epsilon_r$. We solve this problem for three cases; $\epsilon_r=1$; $\epsilon_r=4.0$, and $\epsilon_r=1000,000$. The last case is done to demonstrate that the approach is robust and works accurately for very high dielectric constants. We make the dielectric very thin so that we can check the answers against the ideal parallel-plate solution of such a structure. The plates are 1 cm—by 1-cm, with dielectric thickness 0.0001 cm. The are subdivided into an array of 4-by-4 square cells, and the dielectric is subdivided into and array of 4- and -4- by 3 cells.

4 Numerical Tests For Capacitance Calculation Method

For this problem, $N_i=48$, $N_d=48$, $N_c=32$ and $N_p=2$.

The solution for the above problem is given below, with the expected closed-from answer.

| Relative Dielectric Constant | New Algorithm | Analytical Formula |
| --- | --- | --- |
| $\epsilon_r$ | C[pF] | C[pF] |
| 1.0 | 885.4 | 885.4 |
| 4.0 | 3541.8 | 3541.6 |
| $10^6$ | $8.854 \: 10^8$ | $8.854 \: 10^8$ |

Regarding solution time and storage, the previous solution would have required the LU decomposition of an $(N_i+N_d+N_c)$ by $(N_i+N_d+N_c)$ matrix (128×128). The new solution requires the inverse of an $(N_d+N_c)$ by $(N_d+N_c)$ matrix (80×80) corresponding to Eq. 12, a relatively inexpensive compression corresponding to the generation of Eq. 15 and several sparse mathematical operations. The spare operations involve $cs_{ii}$, $cs_{id}$, $cs_{di}$, $cs_{dd}$. The sub-matrices $cs_{di}$ and $cs_{id}$, which are transposes of each other, have a maximum of $2N_d$ non-zero entries. As the number of internal dielectric nodes increases with respect to the sum of the number of conductor and surface dielectric nodes, the savings in storage and run time grow rapidly.

5 Summary

We have presented a computational procedure for obtaining a capacitance models which is of importance in many different applications like the electrical characterization of VLSI interconnects and microwave circuits. The results obtained from this technique are clearly superior in stability to previous methods.

What is claimed:

1. A method comprising:
   (a) specifying a first electrical circuit comprising a three dimensional geometry, said geometry having a dielectric portion and a conductor portion;
   (b) identifying regions within said geometry which have the same or different dielectric constants; and
   (c) generating a second electrical circuit derived from said first electrical circuit, said second electrical circuit having capacitive couplings which are:
      i. localized to said conductor portion;
      ii. localized to dielectric interfaces;
      iii. localized to dielectric regions;
      iv. between said conductor portion and said dielectric interfaces;
      v. between said dielectric regions and said conductor portion; and
      vi. between said dielectric regions and said dielectric interfaces,
   wherein said capacitive couplings localized to said conductor portion, localized to said dielectric interfaces and between said conductor portion and said dielectric interfaces are computed using an integral equation technique, and
   wherein said capacitive couplings localized to said dielectric regions, between said dielectric regions and said conductor portion, and between dielectric regions and dielectric interfaces are computed using a finite difference technique.

2. A method according to claim 1, wherein said specifying further comprises discretizing said three dimensional geometry for generating an enhanced second electrical circuit.

3. A method according to claim 2, wherein said discretization identifies charge distributions when said second electrical circuit is energized.

4. A method for modeling capacitances in a circuit comprising:
   dividing said circuit into cells;
   identifying cells associated with conductor regions, dielectric regions and dielectric interface regions;
   determining capacitances for cells associated with said dielectric regions;
   generating a first set of equations which contains a first short circuit capacitance matrix for cells associated with said conductor regions and said dielectric interface regions;
   augmenting said first short circuit capacitance matrix by stamping said capacitances for said cells associated with said dielectric regions into said first set of equations to create a second set of equations having a second short circuit capacitance matrix for said circuit;
   compressing matrix entries corresponding to cells associated with conductor regions in said second short circuit capacitance matrix to form a third set of equations having a third short circuit capacitance matrix; and
   determining matrix entries for said third short circuit capacitance matrix to model capacitances for said system.

5. A method for modeling capacitances in a system according to claim 4, wherein said determining capacitances for dielectric regions comprises utilizing an ideal parallel-plate approximation using at least one of excess relative dielectric constant, areas of plates and distances between plates.

6. A method for modeling capacitances in a system according to claim 4, wherein said generating said first set of equations comprises:
   generating a fourth set of equations associated with at least one of the electrical potential for said cells, the total charge on said cells and the normalized coefficients of electrical potential for said cells;
   reducing said fourth set of equations to form a fifth set of equations involving cells corresponding to said conductor regions and said dielectric interface regions; and
   inverting said fifth set of equations.

7. A method for modeling capacitances in a system according to claim 4, wherein said stamping said capacitances comprises using Modified Nodal Analysis.

8. A method for modeling capacitances in a system according to claim 4, wherein said method is computer implemented.

9. A signal-bearing medium tangibly embodying a program of machine-readable instructions executable by a digital data processing apparatus to perform a method for modeling capacitances, said method comprising:
   dividing said circuit into cells;
   identifying cells associated with conductor regions, dielectric regions and dielectric interface regions;
   determining capacitances for cells associated with said dielectric regions;
   generating a first set of equations which contains a first short circuit capacitance matrix for cells associated with said conductor regions and said dielectric interface regions;
   augmenting said first short circuit capacitance matrix by stamping said capacitances for said cells associated with said dielectric regions into said first set of equations to create a second set of equations having a second short circuit capacitance matrix for said circuit;
   compressing matrix entries corresponding to cells associated with conductor regions in said second short circuit capacitance matrix to form a third set of equations having a third short capacitance matrix; and
   determining matrix entries for said third short circuit capacitance matrix to model capacitances for said system.

10. A signal-bearing medium according to claim 9, wherein said determining capacitances for dielectric regions comprises utilizing an ideal parallel-plate approximation using at least one of excess relative dielectric constant, areas of plates and distances between plates.

11. A signal-bearing medium according to claim 9, wherein said generating said first set of equations comprises:

generating a fourth set of equations associated with at least one of the electrical potential for said cells, the total charge on said cells and the normalized coefficients of electrical potential for said cells;

reducing said fourth set of equations to form a fifth set of equations involving cells corresponding to said conductor regions and said dielectric interface regions; and inverting said fifth set of equations.

12. A signal-bearing medium according to claim 9, wherein said stamping said capacitances comprises using Modified Nodal Analysis.

* * * * *